(12) United States Patent
Wang et al.

(10) Patent No.: US 10,194,529 B2
(45) Date of Patent: Jan. 29, 2019

(54) PARTIAL METAL FILL FOR PREVENTING EXTREME-LOW-K DIELECTRIC DELAMINATION

(71) Applicant: QUALCOMM Incorporated, San Diego, CA (US)

(72) Inventors: Zhongze Wang, San Diego, CA (US); Guoqing Chen, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 165 days.

(21) Appl. No.: 15/268,479

(22) Filed: Sep. 16, 2016

(65) Prior Publication Data

US 2018/0082776 A1    Mar. 22, 2018

(51) Int. Cl.
| | |
|---|---|
| *H05K 1/02* | (2006.01) |
| *H05K 1/11* | (2006.01) |
| *H05K 3/40* | (2006.01) |
| *H05K 3/42* | (2006.01) |
| *H01F 27/28* | (2006.01) |
| *H01F 27/29* | (2006.01) |
| *H01F 41/04* | (2006.01) |
| *H01L 23/522* | (2006.01) |
| *H01L 23/528* | (2006.01) |
| *H01F 17/00* | (2006.01) |
| *H01L 23/532* | (2006.01) |

(52) U.S. Cl.
CPC ......... *H05K 1/115* (2013.01); *H01F 17/0006* (2013.01); *H01F 27/2804* (2013.01); *H01F 27/29* (2013.01); *H01F 41/042* (2013.01); *H01L 23/5227* (2013.01); *H01L 23/5283* (2013.01); *H05K 3/4038* (2013.01); *H05K 3/421* (2013.01); *H01L 23/5329* (2013.01)

(58) Field of Classification Search
CPC ...... H05K 1/0296; H05K 1/115; H05K 1/116; H05K 3/4038; H05K 3/4053; H05K 3/4061; H05K 3/4069; H05K 3/42; H05K 3/421; H05K 3/429
See application file for complete search history.

(56) References Cited

U.S. PATENT DOCUMENTS

| | | |
|---|---|---|
| 7,224,069 B2 | 5/2007 | Chen |
| 7,888,800 B2 | 2/2011 | Landis |
| 8,138,607 B2 | 3/2012 | Collins et al. |
| 8,552,486 B2 * | 10/2013 | Wu ..................... H01L 23/5223 257/303 |
| 8,748,305 B2 | 6/2014 | Chen |
| 2005/0280152 A1 | 12/2005 | Fitzsimmons et al. |
| 2010/0193945 A1 | 8/2010 | Hochstenbach et al. |
| 2013/0341793 A1 | 12/2013 | Suzumura et al. |
| 2015/0237732 A1 * | 8/2015 | Velez ..................... H05K 1/182 361/763 |

FOREIGN PATENT DOCUMENTS

JP     2008016572 A    1/2008

OTHER PUBLICATIONS

International Search Report and Written Opinion—PCT/US2017/045979—ISA/EPO—dated Nov. 9, 2017.

* cited by examiner

*Primary Examiner* — Jeremy C Norris
(74) *Attorney, Agent, or Firm* — Haynes and Boone, LLP

(57) ABSTRACT

A partial metal fill is provided within the footprint of an ultra-thick-metal (UTM) conductor on a dielectric layer to strengthen the dielectric layer to inhibit delamination of the UTM conductor without inducing significant electrical coupling between the UTM conductor and the partial metal fill.

15 Claims, 8 Drawing Sheets

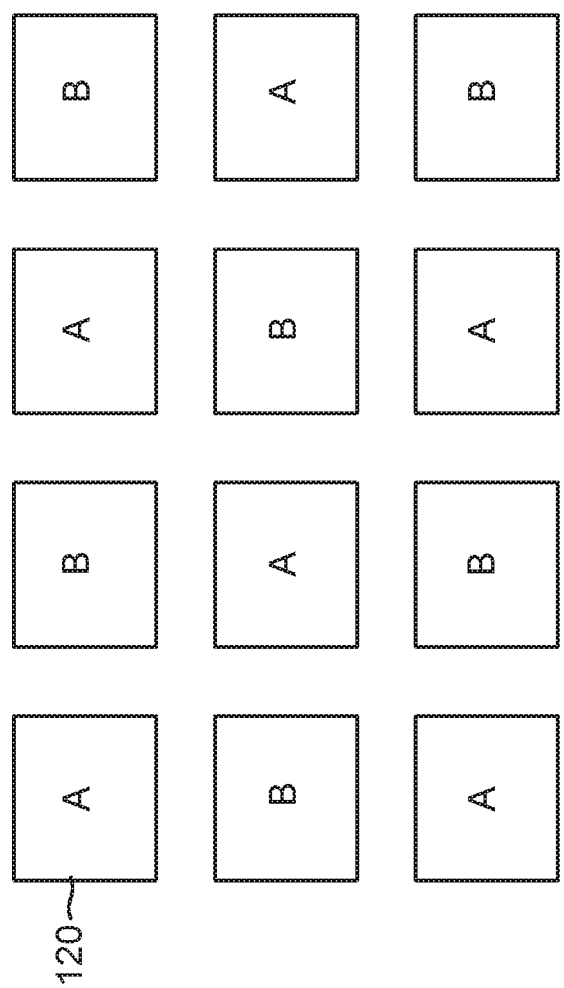

PARTIAL METAL FILL FOR PREVENTING EXTREME-LOW-K DIELECTRIC DELAMINATION

TECHNICAL FIELD

This application relates generally to integrated circuit manufacturing, and more particularly to a metal fill arrangement to prevent the delamination of ultra-thick metal structures from an extreme-low-k dielectric layer.

BACKGROUND

Ultra-Thick Metal (UTM) conductors have reduced resistance as compared to conventional metal layer leads. It is thus conventional to form UTM inductors to provide a high quality factor for RF filters and related circuits. To further increase the quality factor, the UTM conductors are deposited on low-k dielectric materials. To even further increase performance, the UTM conductors are deposited over extreme low-k (ELK) dielectric materials, which have a dielectric constant (k) of approximately 2.5 or less. It is difficult to engineer the dielectric constant so low such that ELK dielectric materials tend to be porous such as porous SiOCH. Although low k and ELK dielectrics advantageously enhance the electrical performance of the corresponding UTM structures, their porosity leads to poor mechanical strength. The tensile strength, hardness, and cohesive strength of ELK dielectrics are much lower than the corresponding strengths for traditional dielectric materials such as silicon dioxide. Delamination of the robust UTM conductors from low k and ELK dielectrics is thus problematic. To strengthen the dielectric layer to inhibit delamination, it is conventional to use a dummy metal fill outside of the UTM footprint. No dummy metal fill is used underneath (within the footprint) of the UTM conductor to prevent reduction of the resulting quality factor due to electrical coupling of the metal fill to the UTM conductor. But delamination remains a problem due to the poor mechanical strength of ELK dielectrics.

Accordingly, there is a need in the art for improving the strength of low-k dielectric and ELK dielectric to prevent the delaimination of UTM conductors.

SUMMARY

An ultra-thick metal (UTM) inductor is provided on a dielectric layer that includes a plurality of metal layers configured with vias into a partial metal fill within a footprint of the UTM inductor. The partial metal fill includes a plurality of interrupted via stacks that couple through pads within the metal layers. The interrupted via stacks do not extend through all the metal layers to inhibit their electrical coupling with the UTM inductor so as to provide a suitably-high quality factor. The dielectric layer may be an extreme-low-k dielectric layer yet the UTM inductor is protected against delamination from the dielectric layer due to the strengthening of the dielectric layer through the partial metal fill.

Outside of the footprint of the UTM inductor on the dielectric layer, the metal layers may be configured with vias to form a plurality of uninterrupted via stacks. The uninterrupted via stacks extend through all the metal layers by coupling through a corresponding metal pad within each metal layer. The uninterrupted via stacks further strengthen the dielectric layer so as to inhibit delamination of the UTM inductor without significantly affecting its quality factor due to the displacement of the uninterrupted via stacks from the UTM inductor.

These and additional advantages may be better appreciated through the following detailed description.

BRIEF DESCRIPTION OF THE DRAWINGS

FIG. 2A is a plan view of a metal layer for a partial metal fill in which the pads are arranged in rows and columns.

Embodiments of the present invention and their advantages are best understood by referring to the detailed description that follows. It should be appreciated that like reference numerals are used to identify like elements illustrated in one or more of the figures.

DETAILED DESCRIPTION

To provide increased resistance to delamination, a substrate is provided with dielectric layers including a plurality of metal layers. Each metal layer is patterned with pads that are interconnected by vias. Since the patterned metal layers and vias do not provide electrical coupling to any circuits, they may be designated as "dummy" metal fill. The dielectric layer lies between the substrate and a ultra-thick-metal (UTM) conductor having a footprint on the dielectric layers. Within the footprint, the metal vias are arranged to form interrupted vias chains that do not extend through all the metal layers. These interrupted vias chains hinder delamination of the UTM conductor from the dielectric layers without unduly lowering the quality factor for the UTM conductor. In contrast, the via chains extend through all the metal layers outside of the footprint to provide additional strength to the dielectric layers to further hinder delamination of the UTM conductor from the dielectric layers. Since the dielectric layers are homogeneous, the following discussion will refer to "a dielectric layer" for brevity when referring to the dielectric layers separating the metal layers.

Figure 1A:
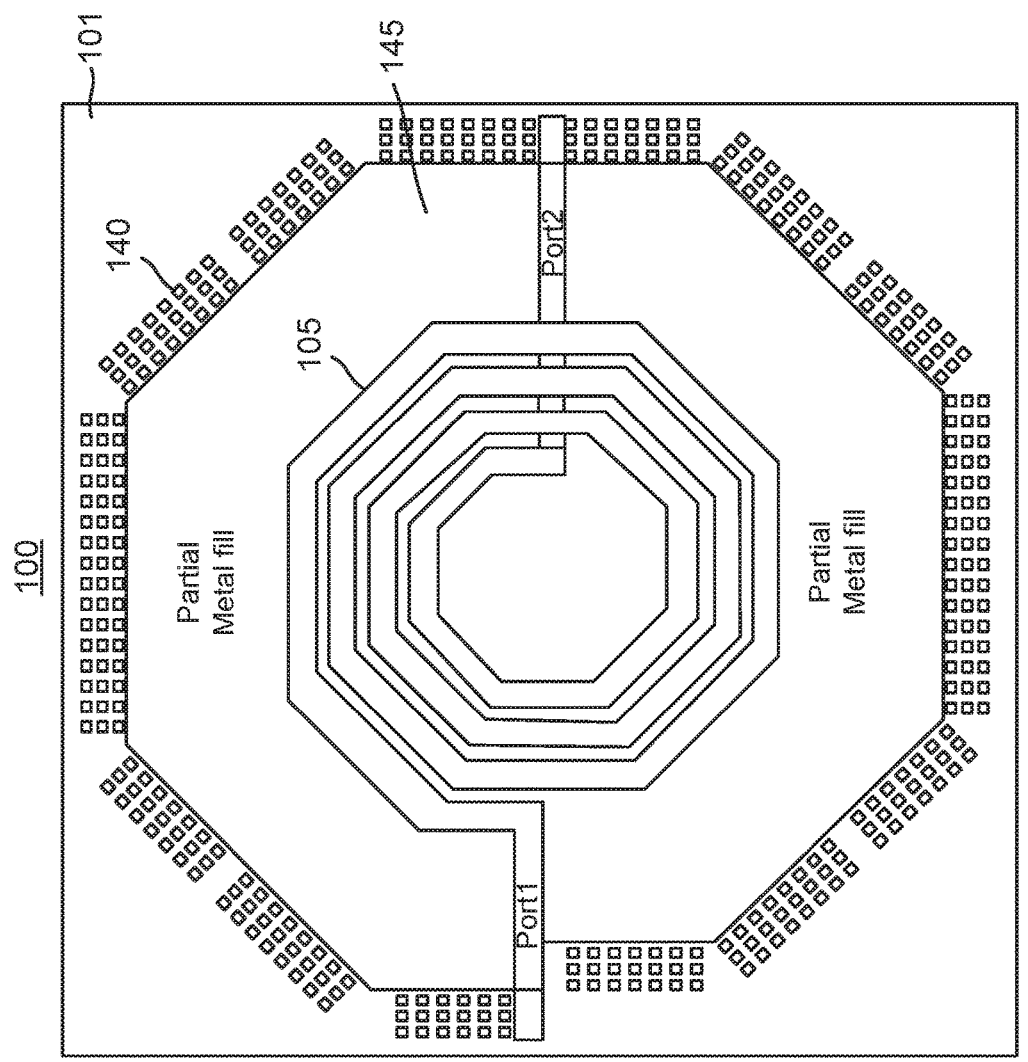
FIG. 1A is a partially cut-away plan view of a UTM inductor package in accordance with an aspect of the disclosure.

Turning now to the drawings, a plan view of an UTM metal inductor 105 within an integrated circuit package 100 is shown in FIG. 1A. UTM metal inductor 105 occupies a footprint 145 on dielectric layer 101. Dielectric layer 101 comprises a low-k or ultra-low-k dielectric material. Examples of suitable ultra-low-k dielectric materials include porous polymeric materials, flourine-doped silicon dioxide, porous silicon dioxide, porous carbon-doped silicon dioxide, xerogels, aerogels, Teflon, and F-doped amorphous carbon. Outside of footprint 145, the metal layers within dielectric layer 101 are arranged into uninterrupted via stacks 140 that extend through all the metal layers. Within footprint 145, the metal layers (not illustrated in FIG. 1A) are arranged into staggered interrupted via stacks as will be discussed further herein. UTM metal inductor 105 forms a number of coils within footprint 145 that are driven through a port 1 and a port 2. These ports couple to leads (not illustrated) within the metal layers in dielectric layer 101 so that an external circuit may drive UTM inductor 105 with an appropriate RF signal. To increase the quality factor for UTM inductor 105, footprint 145 has a lateral extent that is defined by the lateral extension of port 1 and port 2 from the inductor coils. Outside of the ports, the border of the footprint 145 is thus spaced apart from the outermost coil of UTM inductor 105 by the lateral extension of port 1 and port 2 to further reduce the quality-factor-lowering effect of uninterrupted via stacks 140.

The number of metal layers within dielectric layer 101 depends upon the particular process being implemented. As shown in the cross-sectional view of FIG. 1B, there are four metal layers in one embodiment, ranging from a lowermost metal layer M1 through an uppermost metal layer M4. Below metal layer M1 is a substrate 170. Substrate 170 may comprise a dielectric such as silicon oxide or glass or may comprise a semiconductor such as silicon, silicon germanium, or other suitable materials. Each metal layer is patterned to form a plurality of pads 120. As shown in plan view in FIG. 2A, pads 120 may be square or rectangular. In alternative embodiments, pads 120 may be non-rectangular or irregular in shape. Given such an arrangement of pads 120 in each metal layer, dielectric layer 101 is strengthened to inhibit delamination of UTM 105 from dielectric layer 101. Referring again to FIG. 1B, vias 125 couple between pads 120 in adjacent metal layers to form interrupted via stacks 155 to further inhibit the delamination of UTM inductor 105. Each via stack 155 does not extend beyond its corresponding pair of neighboring metal layers. By limiting the height of each via stack 155 to no more than two metal layers, the electrical coupling between interrupted via stacks 155 and UTM inductor 105 is limited to improve its quality factor.

To further reduce the electrical coupling, interrupted via stacks 155 are staggered from one pair of neighboring metal layers to the next pair of neighboring metal layers. This staggering depends upon the arrangement of metal pads 120 within each metal layer. For example, metal pads 120 may be arranged in rows and columns as shown in FIG. 2A. Within each row, alternating ones of metal pads 120 are denoted as "A" pads separated by "B" pads. This alternation of A and B pads is reversed from row to row. The A pads represent the metal pads 120 that couple to vias 125 to form via stacks 155 in a first neighboring pair of metal layers such as metal layers M4 and M3. The B pads represent the metal pads 120 that couple to vias 125 to form interrupted via stacks 155 in the subsequent neighboring pair of metal layers such as metal layers M3 and M2. This alternation or staggering of via stacks 155 from a first pair of neighboring metal layers to the subsequent pair of neighboring metal layers further reduces the electrical coupling between UTM inductor 105 and interrupted via stacks 155. Depending upon this alternation, either the A pads or the B pads in metal layer M1 and M4 will not be included in a via stack 155. For metal layers M2 and M3, the A pads will couple to interrupted via stacks 155 extending in a first direction (either extending above or below the corresponding metal layer) whereas the B pads will couple to interrupted via stacks 155 extending in the opposite direction (the reverse of the first direction).

Figure 2B:
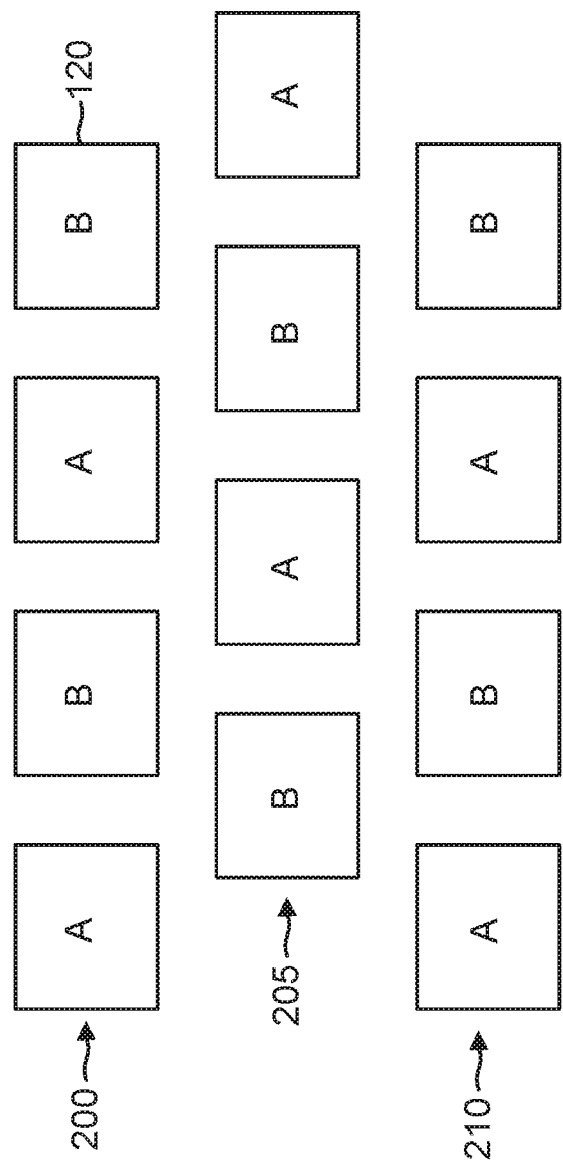
FIG. 2B is a plan view of a metal layer for a partial metal fill in which the pads are arranged in displaced rows.

Metal pads 120 need not be arranged into rows and columns within each metal layer as shown in FIG. 2A. For example, adjacent rows of metal pads 120 may be displaced laterally with respect to each other as shown in FIG. 2B for adjacent rows 200 and 205. In this embodiment, the lateral displacement of row 205 is approximately one half of the separation between metal pads 120 in row 200. A third row 210 is then displaced with regard to row 205 such that rows 210 and 200 are not displaced with respect to each other. In alternative embodiments, row 210 may be displaced with regard to rows 200 and 205. It is believed that the lateral displacement of adjacent rows as shown in FIG. 2B helps to reduce the electrical coupling to UTM inductor 105 to the metal layers in the partial metal fill.

Referring again to FIG. 1B, each uninterrupted via stack 140 outside of footprint 145 includes vias 130 that couple a metal pad 120 from each metal layer M1 through M4 together. Each uninterrupted via stack 140 thus extends through all the metal layers to form a dummy metal fill. Although such an extension would undesirably produce too strong of an electrical coupling to UTM inductor 105 if present within footprint 145, the presence of uninterrupted via stacks 140 has relatively little electrical coupling to UTM inductor 105 due to the displacement of uninterrupted via stacks 140 from UTM inductor 105 by being located outside of footprint 145.

Figure 3:
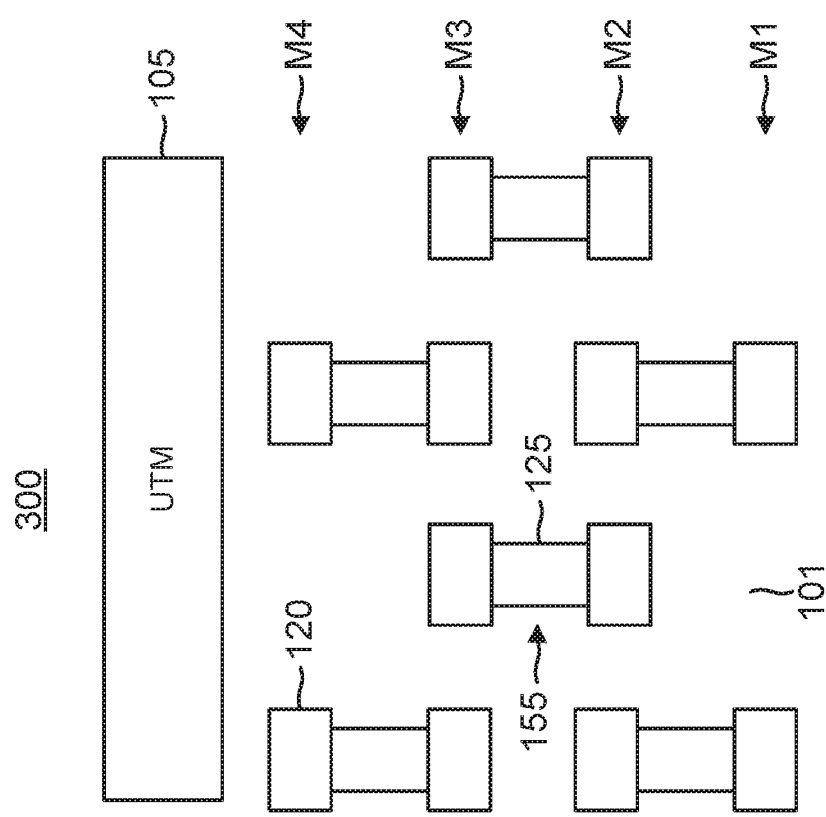
FIG. 3 is a cross-sectional view of a UTM inductor package having a footprint with a partial metal fill in which the vias do not extend beyond adjacent metal layers and in which the pads are not arranged in a regular pattern with respect to each metal layer.
Figure 4:
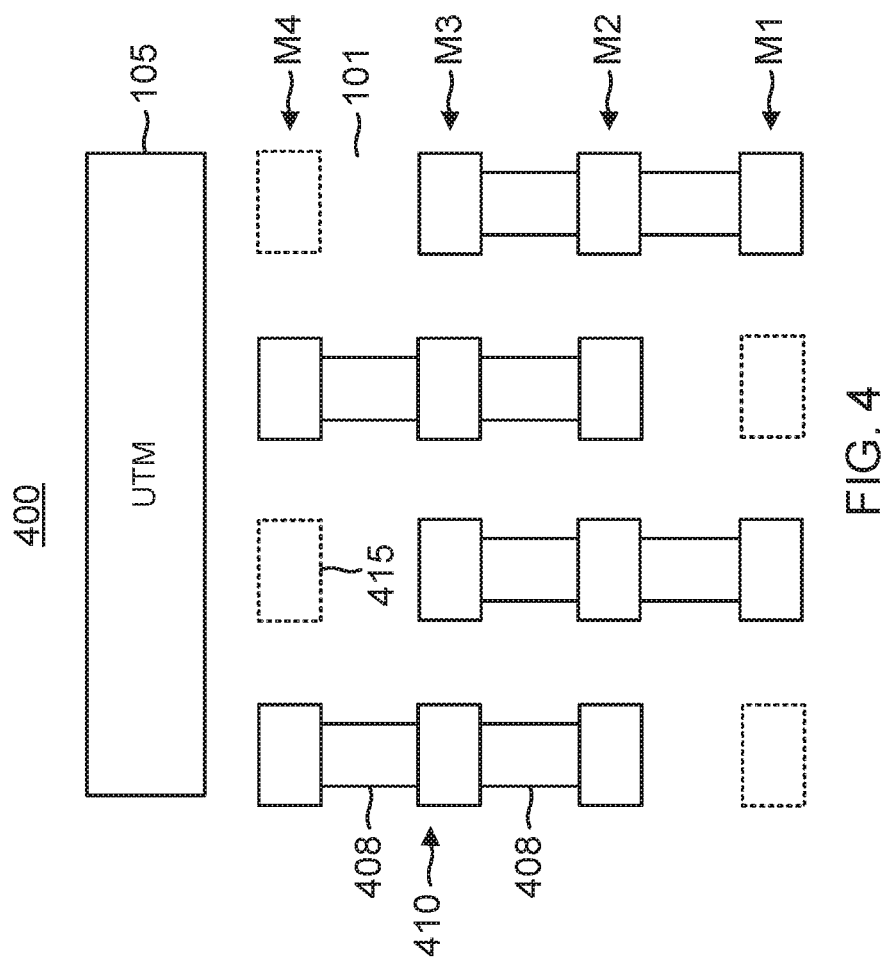
FIG. 4 is a cross-sectional view of a UTM inductor package having a footprint with a partial metal fill in which the vias do not extend beyond three adjacent metal layers and in which the pads are not arranged in a regular pattern from metal layer to metal layer

With regard to the interrupted via stacks 155 within footprint 145, the "orphaned" metal pads 120 in metal layers M1 and M4 that are not included in an interrupted via stack 155 help guard against delamination of UTM inductor 105. However, they still produce some electrical coupling that reduces the quality factor for UTM inductor 105. To eliminate this coupling, the metal pads 120 in metal layers M1 and M4 that do not couple to any interrupted via stacks 155 may be absent as shown in FIG. 3 for an integrated circuit package 300. Within metal layers M2 and M3, metal pads 120 are arranged such as discussed with regard to FIGS. 2A and 2B. But in metal layers M1 and M4, only the A pads (or just the B pads) are present from such pad arrangements. The quality factor for UTM inductor 105 may thus be improved at the cost of slightly reduced delamination resistance A similar compromise between delamination resistance and quality factor involves lengthening the interrupted via stacks beyond just a pair of neighboring metal layers such as shown for interrupted via stacks 410 in a UTM circuit package 400 of FIG. 4. Each interrupted via stack 410 extends across three neighboring metal layers using two vias 408 and three metal pads 120. Such an extension gives greater delamination resistance as compared to interrupted via stacks 155 but introduces slightly more electrical coupling with UTM inductor 105. Interrupted via stacks 410 are staggered such as discussed with regard to FIGS. 2A and 2B. In an embodiment with only four metal layers, there are only two metal layer combinations for each interrupted via stack 410: either they extend across metal layers M4, M3 and M2 or they extend across metal layers M3, M2, and M1. Given such an arrangement, either the A metal pads or B metal pads in metal layers M1 and M4 will be isolated from interrupted via stacks 410. These isolated metal pads 415 are indicated with dotted lines in FIG. 4 since their presence is optional as discussed analogously with regard to FIG. 3. The inclusion of isolated metal pads 415 provides greater delamination resistance at the cost of a reduced quality factor for UTM inductor 105. Should a dielectric layer for a UTM inductor package include more than four metal layers, a mixture of interrupted vias stacks 410 and interrupted vias stacks 155 may be included. In one embodiment, interrupted via stacks 155 and 410 may be deemed to comprise examples of a partial metal fill means within a footprint of the UTM conductor on a dielectric layer for strengthening the dielectric layer against delamination of the UTM conductor from the dielectric layer.

Figure 1B:
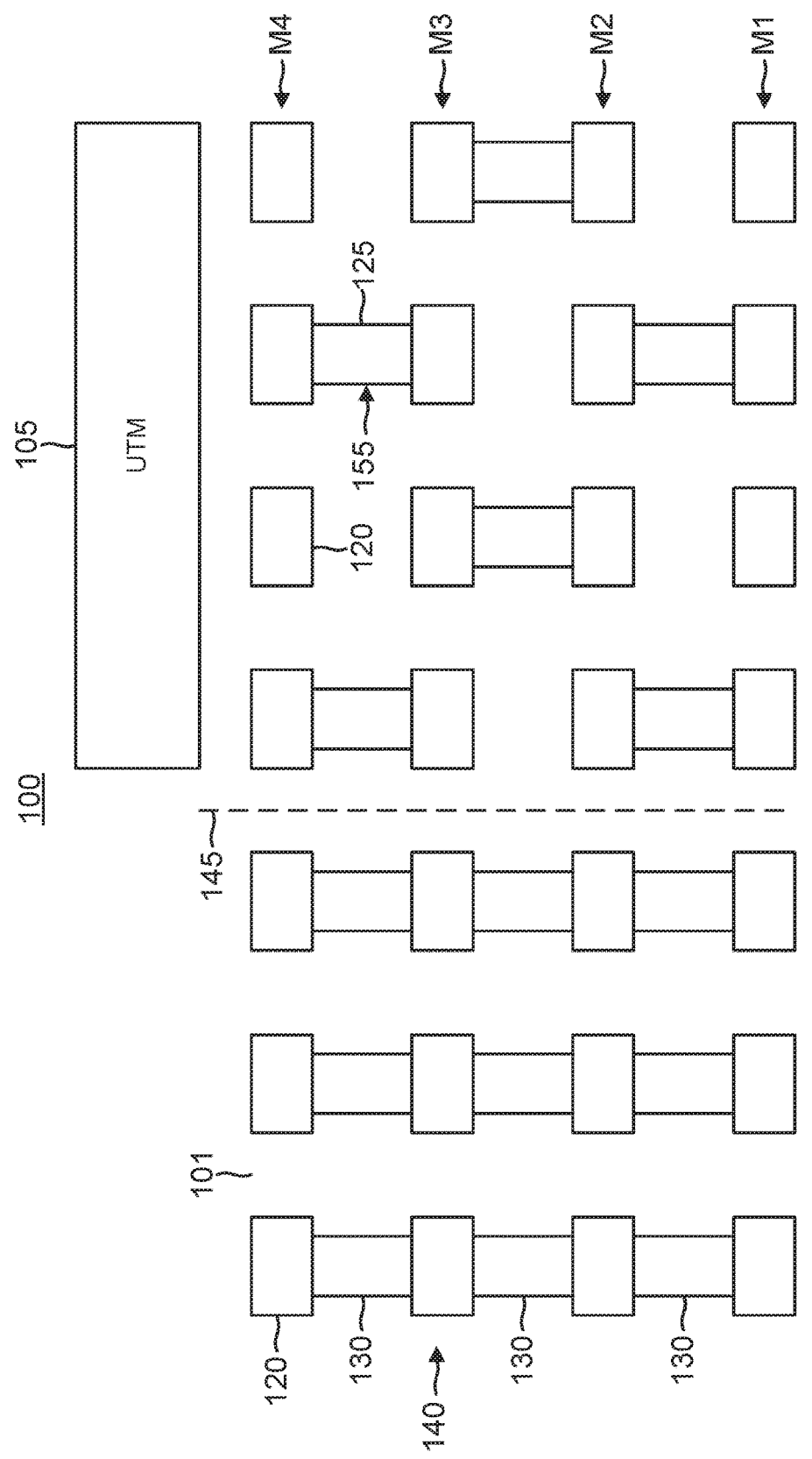
FIG. 1B is a cross-sectional view of a UTM inductor package having a footprint on a dielectric layer including a partial metal fill in which the vias do not extend beyond adjacent metal layers in accordance with an aspect of the disclosure.
Figure 5:
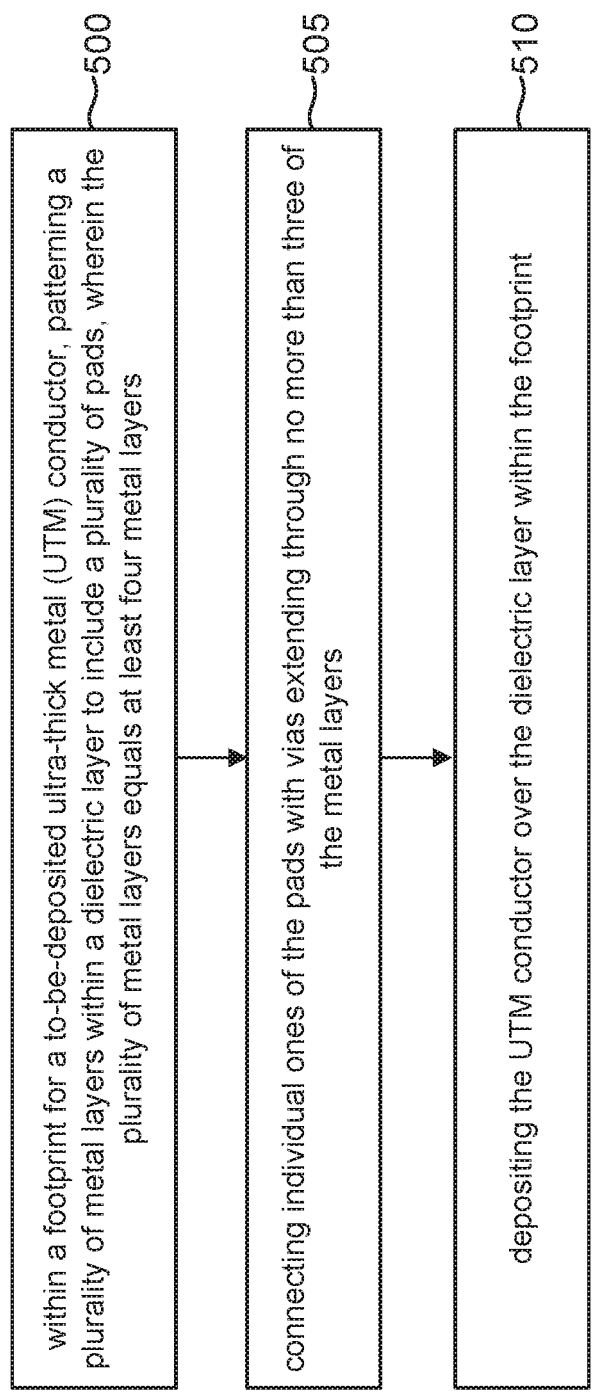
FIG. 5 is a flowchart for a method of manufacturing an ultra-thick-metal conductor package in accordance with an aspect of the disclosure.

A method of manufacturing a UTM inductor on a dielectric metal layer including a partial metal fill will now be discussed with regard to the flowchart of FIG. 5. The method includes an act 500 of, within a footprint for a to-be-deposited ultra-thick-metal (UTM) conductor, patterning a plurality of metal layers within a dielectric layer to include a plurality of pads, wherein the plurality of metal layers includes at least four metal layers. Referring to FIG. 1B, the patterning of metal pads 120 within metal layers M1 through M4 is an example of act 500. Each metal layer may be deposited and patterned using conventional deposition and lithography/etching techniques. After a given metal layer is patterned, a layer of dielectric material is deposited over it so that a subsequent metal layer may be deposited over the new layer of dielectric material. The dielectric layers may be deposited using CVD or spin-on techniques. The metal layer thickness may vary but will generally be a nanometer or less in thickness such as 5 A. The metal layers may comprise copper or another suitable metal such as aluminum.

The method also includes an act 505 of connecting individual ones of the pads with vias extending through no more than three of the metal layers. The deposition of the vias is performed for a given metal layer prior to the deposition of the subsequent metal layer using conventional lithography and etching techniques. The formation of interrupted via stacks 155 or 410 is an example of act 505.

Finally, the method includes an act 510 of depositing the UTM conductor over the dielectric layer within the footprint. The deposition of UTM inductor 105 is an example of act 510 and will generally comprise copper. The deposition of the UTM conductor may be performed using conventional electrodeposition techniques. The thickness of the UTM conductor may vary but will generally be at least three times thicker than the underlying metal layers such as several nanometers.

Figure 6:
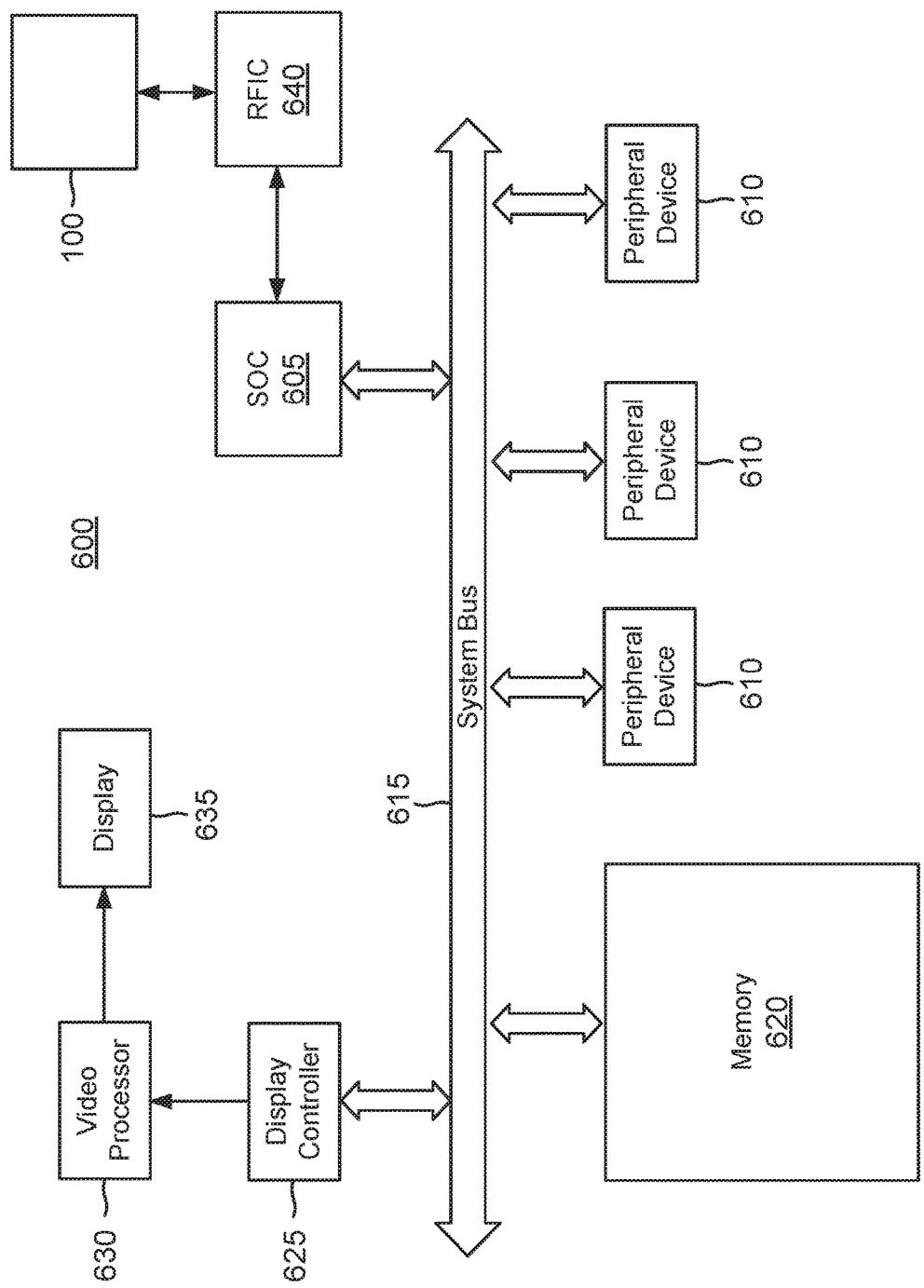
FIG. 6 is a block diagram for an example device incorporating the ultra-thick-metal conductor package produced by the method of FIG. 5.

The delamination protection while maintaining a suitably-high quality factor for an UTM inductor disclosed herein may be advantageously employed in a UTM inductor integrated circuit package 100 included in a device 600 as shown in FIG. 6. Device 600 may comprise a cellular phone, smart phone, personal digital assistant, tablet computer, laptop computer, digital camera, handheld gaming device, or other suitable device. An SOC 605 interfaces with a radio frequency integrated circuit (RFIC) that couples with UTM inductor circuit package 100. In addition, SOC 600 interfaces with a plurality of peripheral devices 610 such as sensors over a system bus 615 that also couples to a memory such as a DRAM 620 and to a display controller 625. In turn display controller 625 couples to a video processor 630 that drives a display 635.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A circuit package, comprising:
   a substrate;
   a dielectric layer on a surface of the substrate;
   a plurality of metal layers within the dielectric layer; and
   an ultra-thick-metal (UTM) conductor on a surface of the dielectric layer; wherein the plurality of metals layers are configured into a plurality of metal pads, and wherein the dielectric layer within a footprint of the UTM conductor is configured with a plurality of vias connecting individual ones of the metal pads between neighboring pairs of the metal layers into a plurality interrupted via stacks that do not extend across more than three of the metal layers.

2. The circuit package of claim 1, wherein a portion of the dielectric layer outside of the footprint of the UTM conductor is configured with a plurality of uninterrupted via stacks, each uninterrupted via stack extending through all of the metal layers.

3. The circuit package of claim 2, wherein the dielectric layer is an extreme-low-k dielectric layer.

4. The circuit package of claim 2, wherein the extreme-low-k dielectric layer is selected from the group consisting of porous polymeric materials, flourine-doped silicon dioxide, porous silicon dioxide, porous carbon-doped silicon dioxide, xerogels, aerogels, Teflon, and F-doped amorphous carbon.

5. The circuit package of claim 2, wherein the UTM conductor is a copper UTM inductor.

6. The circuit package of claim 2, wherein the portion of the dielectric layer surrounds the footprint of the UTM conductor.

7. The circuit package of claim 2, wherein the interrupted via stacks do not extend beyond more than two of the metal layers, and wherein the metal pads are arranged into rows and columns within each metal layer, and wherein the metal pads in each row are arranged in a sequential order from a first metal pad to a last metal pad.

8. The circuit package of claim 7, wherein the interrupted via stacks between a first one of the metal layers and an adjacent second one of the metal layers couple only to every other metal pad in the sequential order for each row beginning at the first metal pad.

9. The circuit package of claim 8, wherein the interrupted via stacks between the second one of the metal layers and an adjacent third one of the metal layers coupled only to every other metal pad in the sequential order for each row beginning at a second one of the metal pads following the first metal pad.

10. The circuit package of claim 7, wherein the interrupted via stacks between a first one of the metal layers and an adjacent second one of the metal layers couple to each metal pad in the first metal layer.

11. The circuit package of claim 2, wherein each interrupted via stack extends across three of the metal layers, and wherein each interrupted via stack in a first set of the interrupted via stacks extends from a first one of the metal layers through a third one of the metal layers, and wherein each interrupted via stack in a second set of the interrupted via stacks extends from a second one of the metal layers though a fourth one of the metal layers, and wherein the interrupted via stacks in the first set are arranged in a pattern that is staggered with regard to a pattern for the interrupted via stacks in the second set.

12. The circuit package of claim 11, wherein each metal pad in the first metal layer couples to a corresponding one of the interrupted via stacks in the first set.

13. The circuit package of claim 11, wherein the first metal layer includes metal pads not coupled to any of the interrupted via stacks in the first set.

14. A method, comprising:
within a footprint for a to-be-deposited ultra-thick metal (UTM) conductor, patterning a plurality of metal layers within a dielectric layer to include a plurality of pads, wherein the plurality of metal layers equals at least four metal layers;
connecting individual ones of the pads with vias not extending across no more than three of the metal layers; and
depositing the UTM conductor over the dielectric layer within the footprint, wherein connecting individual ones of the pads with vias forms a first set of interrupted via stacks extending between a first one of the metal layers to an adjacent second one of the metal layers, the interrupted via stacks in the first set being arranged into a first pattern, and wherein connecting individual ones of the pads with vias forms a second set of interrupted via stacks extending from the second metal layer to an adjacent third one of the metal layers, the interrupted via stacks in the second set being arranged into a second patter that is staggered with regard to the first pattern.

15. The method of claim 14, further comprising connecting individual ones of the pads outside of the footprint with vias extending all of the metal layers.

* * * * *